United States Patent
Zoellin et al.

(10) Patent No.: US 10,051,355 B2
(45) Date of Patent: Aug. 14, 2018

(54) CIRCUIT BOARD FOR A MICROPHONE COMPONENT PART, AND MICROPHONE MODULE HAVING SUCH A CIRCUIT BOARD

(71) Applicant: Robert Bosch GmbH, Stuttgart (DE)

(72) Inventors: Jochen Zoellin, Muellheim (DE); Ricardo Ehrenfordt, Korntal-Muenchingen (DE); Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 115 days.

(21) Appl. No.: 15/036,678

(22) PCT Filed: Sep. 11, 2014

(86) PCT No.: PCT/EP2014/069393
§ 371 (c)(1),
(2) Date: May 13, 2016

(87) PCT Pub. No.: WO2015/071006
PCT Pub. Date: May 21, 2015

(65) Prior Publication Data
US 2016/0295310 A1    Oct. 6, 2016

(30) Foreign Application Priority Data
Nov. 15, 2013    (DE) .................. 10 2013 223 359

(51) Int. Cl.
*H04R 3/00*    (2006.01)
*H04R 19/04*    (2006.01)
(Continued)

(52) U.S. Cl.
CPC .............. *H04R 1/04* (2013.01); *H04R 31/00* (2013.01); *H04R 31/006* (2013.01);
(Continued)

(58) Field of Classification Search
CPC .. H04R 19/04; H04R 1/222; H04R 2201/003; H04R 9/08; H04R 11/04; H04R 17/02; H04R 19/016; H04R 1/342
(Continued)

(56) References Cited

U.S. PATENT DOCUMENTS 4,741,035 A  *  4/1988  Genuit .................. H04R 5/027
                                                381/26
5,870,482 A      2/1999  Loeppert et al.
(Continued)

FOREIGN PATENT DOCUMENTS

EP          2552124         1/2013
EP          2592844         5/2013
WO       WO 02/45463        6/2002

OTHER PUBLICATIONS

International Search Report dated Dec. 22, 2014, of the corresponding International Application PCT/EP2014/069393 filed Sep. 11, 2014.

*Primary Examiner* — George C Monikang
(74) *Attorney, Agent, or Firm* — Norton Rose Fulbright US LLP; Gerard Messina

(57) ABSTRACT

Measures are described by which the back volume of a microphone component can be realized regardless of its packaging. Within the framework of a microphone module, a circuit board is used for the 2nd-level mounting of at least one microphone component part, in whose surface at least one connection opening is formed, which terminates in a cavity in the layer structure of the circuit board. In addition, the circuit board surface having the connection opening is configured for a sealing mounting of the microphone component part above the connection opening, so that the microphone component is acoustically connected to the cavity in the circuit board via the connection opening in the (Continued)

circuit board surface, and this cavity functions as backside volume for the microphone component part.

11 Claims, 2 Drawing Sheets

(51) Int. Cl.
| | | |
|---|---|---|
| *H04R 1/04* | (2006.01) | |
| *H05K 1/18* | (2006.01) | |
| *H04R 31/00* | (2006.01) | |
| *H05K 1/02* | (2006.01) | |
| *H05K 1/11* | (2006.01) | |

(52) U.S. Cl.
CPC ........... *H05K 1/0296* (2013.01); *H05K 1/111* (2013.01); *H05K 1/181* (2013.01); *H04R 2201/003* (2013.01); *H05K 2201/09072* (2013.01); *H05K 2201/10083* (2013.01); *Y02P 70/611* (2015.11)

(58) Field of Classification Search
USPC .................................................. 381/111–115
See application file for complete search history.

(56) References Cited

U.S. PATENT DOCUMENTS

| | | | |
|---|---|---|---|
| 2008/0063233 A1* | 3/2008 | Gorelik | H04R 19/04 381/361 |
| 2008/0157301 A1 | 7/2008 | Ramakrishna et al. | |
| 2010/0086164 A1* | 4/2010 | Gong | B81C 1/0023 381/369 |
| 2012/0027241 A1 | 2/2012 | Turnbull et al. | |
| 2012/0057729 A1* | 3/2012 | Rauscher | B81B 7/0061 381/174 |
| 2012/0177229 A1 | 7/2012 | Lorenz et al. | |
| 2013/0069180 A1* | 3/2013 | Umeda | H04R 19/04 257/416 |

* cited by examiner

CIRCUIT BOARD FOR A MICROPHONE COMPONENT PART, AND MICROPHONE MODULE HAVING SUCH A CIRCUIT BOARD

FIELD

The present invention relates to a circuit board for the 2nd level assembly of a microphone component part. At least one connection opening, which terminates in a cavity in the layer configuration of the circuit board, is developed in at least one surface of this circuit board.

Moreover, the present invention relates to a microphone module provided with such a circuit board.

BACKGROUND INFORMATION

A circuit board and a microphone module are described in U.S. Patent Application Publication No. 2012/0177229 A1. A cavity in the form of an acoustic channel, whose connection openings lie in a main surface of the circuit board, is developed in the layer structure of this circuit board. One of the two connection openings is used as sound entry opening, while a microphone component part for the signal acquisition and signal processing is mounted over the other connection opening. Here, the geometry and dimensioning of the acoustic channel are developed in such a way that it forms an acoustic waveguide or resonator for sound waves of a certain frequency range, in particular for voice signals. This is meant to achieve an especially satisfactory sound introduction at the microphone component.

The microphone component parts that are to be used within the framework of the invention discussed here are equipped with at least one MEMS microphone component and possibly also with further MEMS or ASIC components. The packaging technology (AVT) of these components is designed for mounting on a circuit board. For this purpose, the component parts of such a microphone component can be positioned and wired in a shared housing within the framework of the 1st level assembly. However, they may also be combined in one package together with a circuit board carrier or at the wafer level. The microphone sensitivity of such component parts generally depends on the size of the back volume behind the microphone diaphragm of the microphone component. This back volume is usually enclosed during the 1st level assembly of the microphone component, i.e., during its packaging. The type of packaging therefore defines and limits the size of the back volume of the microphone component.

SUMMARY

In accordance with example embodiments of the present invention, measures are provided by which the back volume of a microphone component can be realized independently of its packaging. These measures allow a reduction of the size of the microphone component without any losses in the microphone sensitivity.

In accordance with the present invention, this may be achieved, for example, by utilizing a cavity in the layer structure of the circuit board for the 2nd level packaging of the microphone component part as back volume. This cavity is sealed, with the exception of the connection opening for the microphone component part, and the circuit board surface with the connection opening is configured for the tight mounting of the microphone component part over the connection opening.

The back volume for a microphone component part therefore is shifted from the component part to the second-level circuit board. Since the size of the back volume is thereby no longer restricted by the structure of the microphone component part, the microphone component is able to be packaged in a much more compact manner. The realization of the back volume of a microphone component part in the second-level circuit board according to the present invention, on which this microphone component is mounted together with other component parts, therefore allows the size of the component part to be reduced, which contributes to lower production costs and to the miniaturization of the microphone component part and the microphone component.

Generally, multiple component parts and component groups featuring functions that supplement each other are combined to form one functional module on a circuit board of the type discussed here. The dimensions of such a circuit board are therefore often clearly larger than the footprint of the microphone component part. In this case, the microphone sensitivity can be enhanced simply in that the cavity in the circuit board laterally extends at least regionally beyond the dimensions of the microphone component part.

In one preferred specific embodiment of the present invention, wall segments and/or support pillars are developed within the cavity in the 2nd level circuit board. Such structural elements increase the stability of the circuit board and simplify its production. Moreover, an oscillation build-up of resonant natural oscillations of the cavity is able to be avoided by suitable positioning and configuring of the wall segments and support pillars. These measures make it possible to shift natural oscillation modes to higher frequencies, ideally to such an extent that the resonant frequency of the cavity lies above the uppermost useful frequency of the microphone component part, especially above 80 kHz.

As already mentioned, the microphone component parts used within the framework of the present invention may have different structures or packaging.

In one first specific development variant, the MEMS microphone component is situated inside a housing in which at least two openings which are transparent to sound are developed, i.e., at least one sound entry opening and at least one mounting-side connection opening. In this case, sound pressure is applied to one side of the microphone structure of the MEMS microphone component via the sound entry opening in the housing, while the other side of the microphone structure is connected to the cavity in the circuit board via the connection opening in the housing and the connection opening in the circuit board.

In a second specific embodiment of the present invention, the microphone component part is realized in the form of a package including a mounting support for the MEMS microphone component. Here, the sound introduction takes place via the side of the microphone structure that faces away from the mounting support, while the other side of the microphone structure is connected to the cavity in the circuit board via a through opening in the mounting support and the connection opening in the circuit board.

In a third specific embodiment, a microphone component in the form of a wafer-level package is used. Here, the package including a MEMS microphone component is mounted directly above the connection opening in the circuit board. In this case as well, the sound introduction takes place via the side of the microphone structure that faces away from the circuit board, while the other side of the microphone structure is connected directly to the connection opening in the circuit board and thus to the cavity in the circuit board.

For the specific example embodiments of the present invention, an acoustically tight connection exists between the microphone component part and the circuit board. It is preferably realized in the form of at least one closed sealing ring at the circumference of the connection opening in the circuit board and/or in the form of a sealing ring which is circumferentially closed in the edge region of the mounting surface of the microphone component part. The connection itself may simply be realized in the form of a soldered connection or a bonded connection.

BRIEF DESCRIPTION OF THE DRAWINGS

As discussed above, there are various possibilities of embodying and further developing the present invention in an advantageous manner. In this regard, reference is made to description below of several exemplary embodiments of the present invention with reference to the figures.

DETAILED DESCRIPTION OF EXAMPLE EMBODIMENTS

Figure 1A:
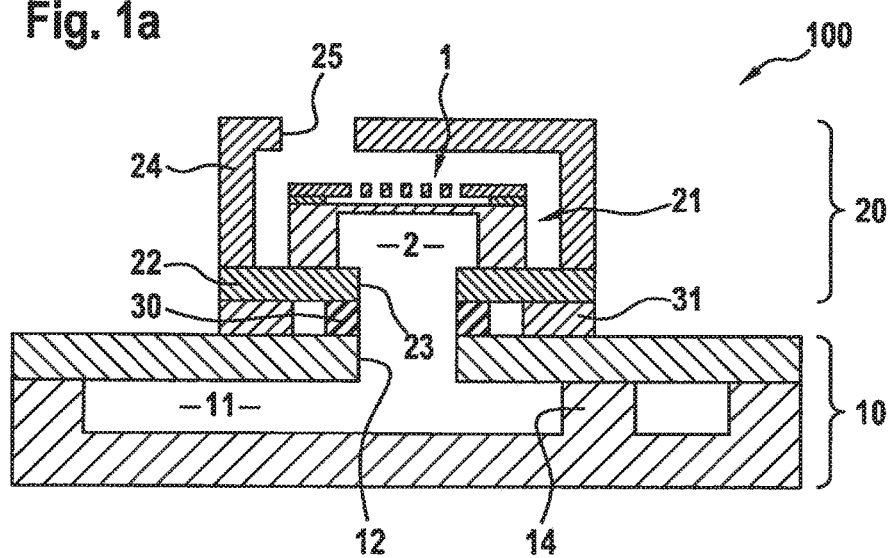
FIG. 1a shows a schematic sectional view of a microphone module 100 having a microphone component part 20 and a 2nd-level circuit board 10 according to the present invention.

Microphone module 100 shown in FIG. 1a includes a microphone component part 20, which has been mounted on a circuit board 10 within the framework of the 2nd-level mounting. Such a 2nd-level circuit board 10 usually serves as support and wiring plane for multiple component parts having different functions that supplement each other, which are combined into one module. Accordingly, the mounting surfaces for the mechanical fixation of the component parts and connection pads and circuit tracks for the electrical contacting and wiring of the component parts are prepared in the layout of a 2nd-level circuit board. A 2nd-level circuit board fitted in this manner may then be used in different applications as a prefabricated subassembly having a specific function scope.

The circuit board 10 is configured especially for mounting a microphone component part 20. Toward this end, a sealed cavity 11 is formed in the layer structure of this circuit board 10, which has only one connection opening 12 in the top side of circuit board 10. Microphone component part 20 is mounted in an airtight manner above connection opening 12, so that cavity 11 is acoustically connected to the back volume of microphone component part 20.

Figure 1B:
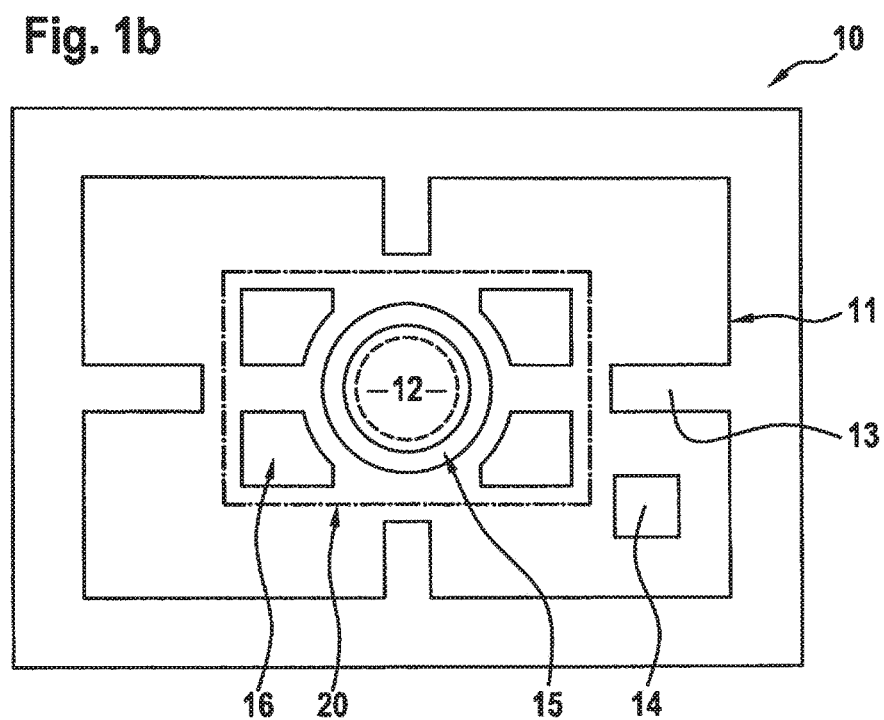
FIG. 1b shows the structure or layout of circuit board 10 with the aid of a schematic plan view.

In the exemplary embodiment illustrated here, wall segments 13 and support pillars 14 are developed within cavity 11, so that the resonant frequency of cavity 11 lies above the uppermost useful frequency of microphone component part 20 and, in particular, above 80 kHz. Cavity 11 within circuit board 10 extends beyond the dimensions, i.e., the base area, of microphone component part 20. The extension of cavity 11 and the positioning of wall segments 13 and support pillars 13 and also the layout of the top surface of the circuit board including mounting surfaces 15 and connection pads 16 is illustrated by FIG. 1b, in particular.

Microphone component part 20 of microphone module 100 is a MEMS microphone component 21 having a housing that is made up of a bottom part 22 and a cover part 24.

Microphone structure 1 having an acoustically active diaphragm and a stationary counter element is developed in the front side of MEMS microphone component 21 and spans an opening 2 in the component backside. A 1st-level circuit board having a through opening 23 is used as housing bottom part 22. MEMS microphone component 21 is mounted on housing bottom part 22 above this through opening 23, so that backside opening 2 of MEMS microphone component 21 and through opening 23 are situated in alignment with each other. Cap-type cover part 24 is situated above MEMS microphone component 21 on bottom part 22 and connected thereto across the periphery. A sound-transparent opening 25 is also developed in cover part 24.

Microphone component part 20 is mounted on 2nd-level circuit board 10 in such a way that through opening 23 in housing bottom part 22 is positioned in alignment with connection opening 12 on circuit board 10. A circumferential, airtight connection 30 exists between annular mounting area 15 in the edge region of connection opening 12 on circuit board 10 and housing bottom part 22, so that the one side of microphone structure 1 is connected to cavity 11 within circuit board 10 via through opening 23 in housing bottom part 22 and connection opening 12 in circuit board 10. Opening 25 in cover part 24 is used as sound entry opening, through which sound pressure is applied to the other side of microphone structure 1 of MEMS microphone component 21.

In addition to tight connection 30, contact connections 31, i.e., electrical connections between microphone component part 20 and connection pads 16 on circuit board 10, were produced when microphone component part 20 was mounted on 2nd-level circuit board 10.

As an alternative or also in addition to sealing ring connection 30 encircling openings 23 and 12, it is possible to provide a sealing ring connection which, in addition to enclosing acoustic connection 23, 12, also encloses electrical contact connections 31 and thereby protects them from environmental effects such as moisture and dirt.

For example, solder or also electrically conductive bonding agents, which may be applied onto the circuit board surface in a screen-printing process, are suitable as connection material for the mechanical, tight connection 30 between microphone component part 20 and 2nd-level circuit board 10 and also for electrical contacting 31 of microphone component part 20. However, it is also possible to use different materials for the mechanical and electrical connection, such as a non-conductive adhesive agent for the mechanical connection, and copper pillars for the electrical contacting.

Figure 2:
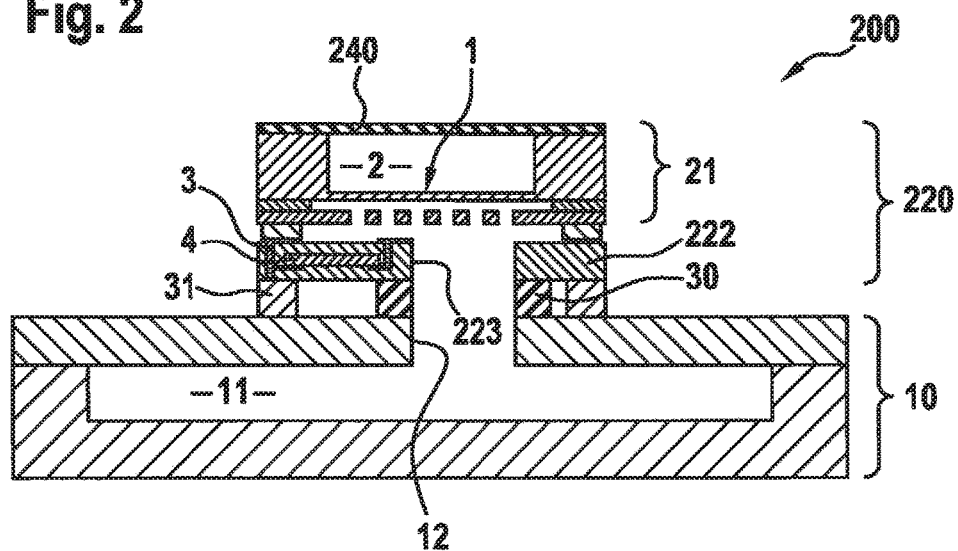
FIGS. 2 and 3 show a schematic sectional view of a structural variant of a microphone module according to the present invention.
Figure 3:
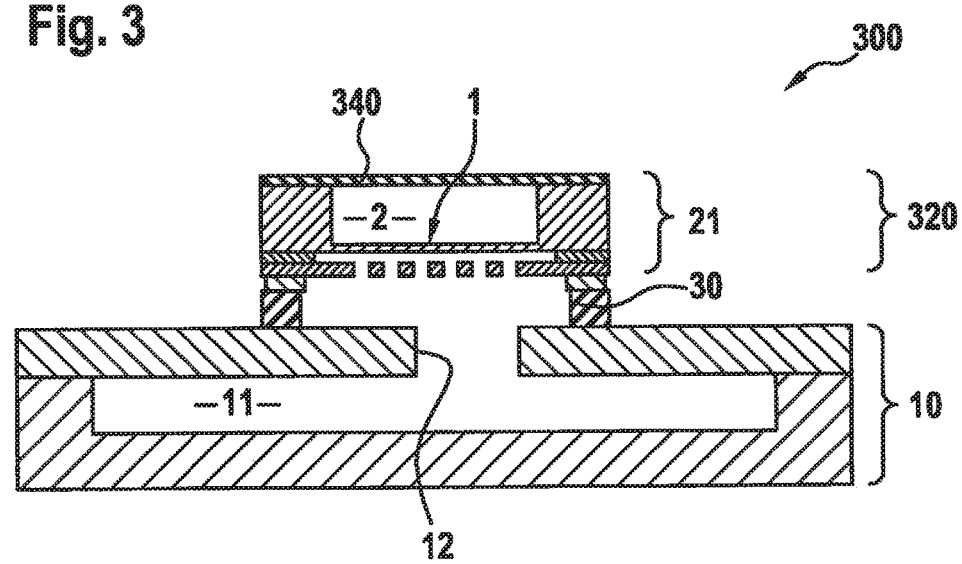

Microphone modules 200 and 300 shown in FIGS. 2 and 3 include a microphone component part 220 and 320 in each case, which are mounted on a 2nd-level circuit board 10. In both exemplary embodiments, a sealed cavity 11 having only one connection opening 12 is developed within circuit board 10 in the topside of circuit board 10. For this purpose 2nd-level circuit board 10 is made up of at least two layers, spaced apart from one another, of an electrically insulating carrier material, which are connected via an intermediate layer structured in the way of a frame. Microphone component 220 or 320 is tightly mounted above connection opening 12 in the upper layer of circuit board 10, in such a way that cavity 11 is connected to the back volume of microphone component part 220 or 320. Cavity 11 within 2nd-level circuit board 10 therefore contributes to the back volume of microphone component part 220 or 320. In both exemplary embodiments, cavity 11 extends beyond the dimensions, i.e., the base area, of microphone component part 220 or 320. Relatively large back volumes can be realized within 2nd-level circuit board 10 in this way, regardless of the size of the component part, i.e., even with a small component part size, in order to achieve the highest signal-noise ratio possible.

Although both microphone component parts 220 and 320 include a MEMS microphone component 21 having a microphone structure 1 developed in the component front side and spanning an opening 2 in the component rear side, they differ in the packaging of this microphone component 21.

For example, in contrast to microphone component part 20 of microphone module 100, microphone component part 220 shown in FIG. 2 does not have a dedicated housing that encloses MEMS microphone component 21 on all sides. To reduce the size of the component part, microphone component part 220 is realized in the form of a stack, so that its base area corresponds to the chip area of MEMS microphone component 21. MEMS microphone component 21 is mounted face-down on a mounting support 222 provided with a through opening 223 for this purpose, in such a way that through opening 223 forms an acoustic connection to microphone structure 1 of MEMS microphone component 21. The backside of MEMS microphone component 21 has been provided with a protective diaphragm 240. It spans backside opening 2 without acoustically sealing it. Here, a 1st-level circuit board, which additionally functions as an intermediate carrier for the mounting on 2nd-level circuit board 10, is used as mounting support 222. Accordingly, electrical contacts 3 of MEMS microphone component 21 are routed from the top surface of MEMS microphone component 21 through mounting support 222. In addition, an evaluation ASIC 4 is embedded in mounting support 222.

Microphone component part 220 is mounted on 2nd-level circuit board 10 in such a way that through opening 223 in mounting support 222 is positioned in alignment with connection opening 12 on circuit board 10. A circumferential, airtight connection 30 exists between annular mounting area 15 in the edge region of connection opening 12 on circuit board 10 and mounting support 222, so that the one side of microphone structure 1 is connected to cavity 11 within circuit board 10 via through opening 223 in mounting support 222 and connection opening 12 in circuit board 10. Here, sound is applied to microphone structure 1 via protective diaphragm 240 and via opening 2 in the backside of MEMS microphone component 21.

Here, too, as in the case of microphone module 100, contact connections 31, i.e., electric connections, were produced between microphone component part 220 and the connection pads on circuit when microphone component part 220 was mounted on 2nd-level circuit board 10.

In the case of microphone module 300 shown in FIG. 3, MEMS microphone component 21 was merely provided with a rear-side, acoustically permeable protective diaphragm 340 and then mounted directly on 2nd-level circuit board 10. Microphone structure 1 is positioned face-down above connection opening 12 in the circuit board top surface. A circumferential, airtight connection 30 exists between annular mounting area 15 in the edge region of connection opening 12 on circuit board 10 and the top side of MEMS microphone component 21, so that the one side of microphone structure 1 is acoustically connected to cavity 11 within circuit board 10 via connection opening 12 in circuit board 10. Sound is applied to microphone structure 1 via acoustically permeable protective diaphragm 340 and opening 2 in the backside of MEMS microphone component 21. In the case of microphone module 300, an electrically conductive connection material such as solder was used, so that microphone component 320 or the MEMS microphone component is also electrically connected to 2nd-level circuit board 10 via the mechanically tight connection 30.

The afore-described exemplary embodiments illustrate that shifting the back volume from the upper structure of the microphone component part to the 2nd-level circuit board allows a simplification and a clear size reduction of the component part structure, i.e., regardless of the size of the back volume, and therefore also regardless of the microphone performance.

What is claimed is:

1. A circuit board, comprising:
   at least one mounting surface including connection pads and circuit tracks for mechanical fixation and electrical contacting and wiring of at least one microphone component part, the mounting surface including at least one connection opening which terminates in a cavity in a layer structure of the circuit board, the cavity being sealed as back volume for the microphone component part, the circuit board surface with the connection opening being configured for a tight mounting of the microphone component part above the connection opening, wherein at least one of: (i) wall segments which extend from at least one wall of the cavity into the cavity, and (ii) support pillars which extend from a floor of the cavity, being within the cavity, so that a resonant frequency of the cavity lies above an uppermost useful frequency of the microphone component part.

2. The circuit board as recited in claim 1, wherein the resonant frequency of the cavity lies above 80 kHz.

3. The circuit board as recited in claim 2, wherein the at least one of: (i) the wall segments which extend from at least one wall of the cavity into the cavity, and (ii) the support pillars which extend from a floor of the cavity, include at least four wall segments, each of which extending from a respective wall of the cavity into the cavity.

4. A microphone module, comprising:
   a circuit board having at least one mounting surface including connection pads and circuit tracks for mechanical fixation and electrical contacting and wiring of at least one microphone component part, the mounting surface including at least one connection opening which terminates in a cavity in a layer structure of the circuit board, the cavity being sealed as back volume for the microphone component part, the circuit board surface with the connection opening being configured for a tight mounting of the microphone component part above the connection opening, wherein at least one of: (i) wall segments which extend from a wall of the cavity into the cavity, and (ii) support pillars which extend from a floor of the cavity, being within the cavity, so that a resonant frequency of the cavity lies above an uppermost useful frequency of the microphone component part; and
   at least one microphone component part mounted on the circuit board so that the microphone component part is acoustically connected to the cavity in the circuit board via the connection opening in the circuit board surface and the cavity functioning as backside volume for the microphone component part.

5. The microphone module as recited in claim 4, wherein the cavity within the circuit board laterally extends at least regionally beyond dimensions of the microphone component part.

6. The microphone module as recited in claim 4, wherein the microphone component part includes at least one MEMS microphone component which is situated in a housing, the housing having at least one sound entry opening and at least one mounting-side connection opening, so that sound pressure can be applied to the one side of the microphone structure of the MEMS microphone component, while the other side of the microphone structure is connected, via the connection opening in the housing and the connection opening in the circuit board, to the cavity in the circuit board.

7. The microphone module as recited in claim 4, wherein the microphone component part includes at least one MEMS microphone component, which is mounted on a mounting support having a through opening, and the sound introduction takes place via a side of the microphone structure that faces away from the mounting support, while the other side of the microphone structure is connected to the cavity in the circuit board via the through opening in the mounting support and the connection opening in the circuit board.

8. The microphone module as recited in claim 4, wherein the microphone component part is in the form of a wafer-level package having a MEMS microphone component, which is mounted directly above the connection opening in the circuit board and is thereby acoustically connected to the cavity in the circuit board, and sound introduction takes place via a side of the microphone structure that faces away from the circuit board.

9. The microphone module as recited in claim 4, wherein an acoustically tight connection exists between the microphone component part and the circuit board, the connection being in the form of at least one of: i) at least one closed sealing ring at a circumference of the connection opening in the circuit board, and ii) a closed sealing ring which is circumferentially closed in a edge region of the mounting surface of the microphone component part.

10. The microphone module as recited in claim 4, wherein the acoustically tight connection between the microphone component part and the circuit board is in the form of one of: i) a soldered connection, or ii) an adhesive bond connection.

11. The microphone module as recited in claim 4, wherein the at least one of: (i) the wall segments which extend from at least one wall of the cavity into the cavity, and (ii) the support pillars which extend from a floor of the cavity, include at least four wall segments, each of which extending from a respective wall of the cavity into the cavity.

* * * * *